US010449755B2

(12) United States Patent
Watanabe et al.

(10) Patent No.: US 10,449,755 B2
(45) Date of Patent: Oct. 22, 2019

(54) DEVICE FOR DELAMINATING LAMINATE, DELAMINATION METHOD, AND METHOD FOR MANUFACTURING ELECTRONIC DEVICE

(71) Applicant: AGC Inc., Chiyoda-ku (JP)

(72) Inventors: Yasuaki Watanabe, Tokyo (JP); Koji Nakamura, Tokyo (JP); Tsubasa Kondo, Tokyo (JP); Yasunori Ito, Tokyo (JP); Yuki Hori, Tokyo (JP); Hiroshi Utsugi, Tokyo (JP)

(73) Assignee: AGC Inc., Chiyoda-ku (JP)

( * ) Notice: Subject to any disclaimer, the term of this patent is extended or adjusted under 35 U.S.C. 154(b) by 0 days.

(21) Appl. No.: 15/946,820

(22) Filed: Apr. 6, 2018

(65) Prior Publication Data

US 2018/0222176 A1    Aug. 9, 2018

Related U.S. Application Data

(63) Continuation of application No. PCT/JP2016/080195, filed on Oct. 12, 2016.

(30) Foreign Application Priority Data

Oct. 16, 2015   (JP) ................................. 2015-204166

(51) Int. Cl.
*B23B 43/00* (2006.01)
*H01L 21/67* (2006.01)
(Continued)

(52) U.S. Cl.
CPC ............ *B32B 43/006* (2013.01); *B32B 15/04* (2013.01); *B32B 17/06* (2013.01); *B32B 27/08* (2013.01);
(Continued)

(58) Field of Classification Search
CPC ............ B32B 43/006; Y10T 156/1168; Y10T 156/1978; Y10T 156/1989; Y10S 156/93;
(Continued)

(56) References Cited

U.S. PATENT DOCUMENTS

| 6,258,666 B1* | 7/2001 | Mizutani ................. C23C 16/01 |
| | | 438/258 |
| 9,475,270 B2* | 10/2016 | Xie ........................ B32B 43/006 |
| 2004/0166653 A1* | 8/2004 | Kerdiles ................ G01N 19/04 |
| | | 438/458 |
| 2006/0131260 A1* | 6/2006 | Okuyama ............. H05K 3/007 |
| | | 216/13 |
| 2013/0062020 A1* | 3/2013 | Ries ................. H01L 21/67092 |
| | | 156/715 |

(Continued)

FOREIGN PATENT DOCUMENTS

| JP | 2004-142878 | 5/2004 |
| JP | 2008-306120 | 12/2008 |

(Continued)

OTHER PUBLICATIONS

International Search Report dated Nov. 8, 2016 in PCT/JP2016/080195 filed on Oct. 12, 2016 (with English Translation).
(Continued)

*Primary Examiner* — Mark A Osele
(74) *Attorney, Agent, or Firm* — Oblon, McClelland, Maier & Neustadt, L.L.P.

(57) ABSTRACT

A movable member is gripped in a delamination-start configuration, and the other-end side of a rib of a delamination member is pressed towards the other-end side of a flexible plate. The flexible plate then warps and deforms about the other end side of the flexible plate, which is supported by a support member, the flexible plate deforming along the direction in which delamination progresses. In concert with the delamination action, a reinforcing plate also warps and
(Continued)

deforms along with the flexible plate, the reinforcing plate being vacuum-chucked to an air-permeable electroconductive sheet on the flexible plate, and the reinforcing plate is sequentially delaminated from a substrate 2 along the direction in which delamination progresses.

20 Claims, 12 Drawing Sheets

(51) Int. Cl.
    *B32B 43/00*     (2006.01)
    *B32B 15/04*     (2006.01)
    *B32B 17/06*     (2006.01)
    *B32B 27/08*     (2006.01)
    *H01L 21/683*     (2006.01)

(52) U.S. Cl.
CPC .... *H01L 21/67092* (2013.01); *H01L 21/6838* (2013.01); *B32B 2315/08* (2013.01); *B32B 2457/202* (2013.01); *B32B 2457/204* (2013.01); *B32B 2457/206* (2013.01); *B65H 2301/51122* (2013.01); *H01L 2221/68318* (2013.01); *H01L 2221/68386* (2013.01); *Y10S 156/93* (2013.01); *Y10S 156/941* (2013.01); *Y10T 156/1168* (2015.01); *Y10T 156/1978* (2015.01)

(58) Field of Classification Search
CPC ....... Y10S 156/941; H01L 2221/68318; H01L 2221/68386

See application file for complete search history.

(56) References Cited

U.S. PATENT DOCUMENTS

2015/0122427 A1\* 5/2015 Koo .................... B32B 43/006
                                                            156/707
2018/0222175 A1\* 8/2018 Lee ..................... B32B 43/006

FOREIGN PATENT DOCUMENTS

| JP | 2014-141344 | 8/2014 | |
|----|-------------|--------|---|
| JP | 2014-159337 | 9/2014 | |
| JP | 2015-145306 | 8/2015 | |
| WO | WO-2015077012 A1 \* | 5/2015 | ........... B32B 43/006 |

OTHER PUBLICATIONS

Written Opinion dated Nov. 8, 2016 in PCT/JP2016/080195 filed on Oct. 12, 2016.

\* cited by examiner

DEVICE FOR DELAMINATING LAMINATE, DELAMINATION METHOD, AND METHOD FOR MANUFACTURING ELECTRONIC DEVICE

TECHNICAL FIELD

The present invention relates to a peeling device and a peeling method of a laminate, and a manufacturing method of an electronic device.

BACKGROUND ART

Accompanying with thickness reductions and weight reductions of electronic devices, such as display panels, solar cells and thin-film secondary batteries, there is a demand for reducing thickness of a substrate (a first substrate), such as a glass plate, a resin plate and a metal plate used in those electronic devices.

However, when the thickness of the substrate is reduced, a handling property of the substrate deteriorates, and therefore it becomes difficult to form a functional layer (a thin film transistor (TFT), a color filter (CF)) used in an electronic device on a surface of the substrate.

Accordingly, a manufacturing method of an electronic device in which a functional layer is formed on a surface of a substrate in a state where a reinforcing plate (a second substrate) is laminated on a back surface of the substrate to configure a laminate has been proposed. In this manufacturing method, since the handling property of the substrate is enhanced, the functional layer can be favorably formed on the surface of the substrate. The reinforcing plate is peeled off from the substrate after the formation of the functional layer (for example, Patent Document 1).

The peeling method of the reinforcing plate disclosed in Patent Document 1 is performed by bending deformation of a reinforcing plate, or a substrate, or both of them in a direction to separate them from each other along a peeling proceeding direction from one end portion side toward the other end portion side of two corners located on a diagonal line of a rectangular-shaped laminate. A plurality of movable bodies fixed on a flexible plate is independently moved while one of the reinforcing plate and the substrate is held by the flexible plate and the other thereof is held by a holding member, and the flexible plate is subjected to bending deformation along the peeling proceeding direction. In this manner, this bending deformation is performed.

The peeling device disclosed in Patent Document 1 has one or three servo cylinders for bending deformation of the flexible plate. The longitudinal axis of the servo cylinder is arranged along the peeling proceeding direction, and a tip end portion of a piston of the servo cylinder is supported on one end portion side of the flexible plate. When the piston of the servo cylinder is towed, the power is transmitted to the one end portion side of the flexible plate, the flexible plate starts bending deformation, and an interface between the substrate and the reinforcing plate is peeled off due to bending moment caused by continuous bending deformation of the flexible plate.

Patent Document 2 discloses a peeling device for peeling off a flexible film such as a plastic film from a reinforcing plate.

The peeling device disclosed in Patent Document 2 has a mounting table for holding a non-sticking surface of a flexible film substrate (a laminate of the flexible film and the reinforcing plate), and a peeling unit which peels off the reinforcing plate from the flexible film.

The peeling unit includes a rotating body having a holding portion which holds the reinforcing plate, a rotating member which rotates the rotating body, a frame which rotatably holds the rotating body in a cantilever manner, and a moving member which moves the frame. In addition, a holding surface of the holding portion is a curved surface so as to hold the reinforcing plate in a curved manner.

In the peeling method of the reinforcing plate by the peeling device disclosed in Patent Document 2, the flexible film of the flexible film substrate is adsorbed and held on the mounting table. Next, the frame is horizontally moved by the moving member and the rotating body is rotated by the rotating member such that a start point of the holding portion of the peeling unit is positioned directly above the one end side of the reinforcing plate. Thereafter, the mounting table is moved upward toward the holding portion, and one end side of the reinforcing plate and the start point of the holding portion are in contact with each other under a predetermined pressure. Thereafter, the one end side of the reinforcing plate is adsorbed and held on the start point of the holding portion, the frame is horizontally moved to the other side by the moving member, and the rotating body is rotated by the rotating member. Thus, the reinforcing plate is peeled off from the flexible film while being sequentially bent from one end side toward the other end side of the reinforcing plate.

BACKGROUND ART DOCUMENT

Patent Document

Patent Document 1: JP-A-2014-159337
Patent Document 2: JP-A-2004-142878

SUMMARY OF THE INVENTION

Problems that the Invention is to Solve

However, there is a problem that the peeling device disclosed in Patent Document 1 is expensive and heavy since the peeling device has a servo cylinder as a member for bending deformation of the flexible plate. In addition, there is also a problem that the peeling device disclosed in Patent Document 2 has a moving member which moves the frame and a rotating member which rotates the rotating body, whereby the structure thereof is complicated, and a control member for synchronizing the movement of the moving member and the rotation of the rotating member is required, whereby the device becomes complicated.

An object of the present invention is to provide a peeling device and a peeling method of a laminate capable of peeling off a first substrate and a second substrate from each other with a simple structure and a simple operation, and a manufacturing method of an electronic device.

Means for Solving the Problems

In order to achieve the object of the present invention, one aspect of a peeling device of a laminate of the present invention is a peeling device of a laminate, the laminate including a first substrate and a second substrate stuck thereon, the peeling device sequentially peeling off an interface between the first substrate and the second substrate along a peeling proceeding direction from one end portion side toward the other end portion side of the laminate by bending deformation of one substrate of the first substrate and the second substrate, in which the peeling device includes: a flexible plate having an adsorption surface which
} adsorbs and holds the one substrate; a peeling member arranged to face a counter-adsorption surface of the flexible plate which is on a side opposite to the adsorption surface, in which a surface of the peeling member facing the counter-adsorption surface is configured as a convex surface, and one end portion side of the peeling member is fixed to one end portion side of the flexible plate and a part of the convex surface is brought into contact with the counter-adsorption surface so that the other end portion side of the peeling member is spaced from the other end portion side of the counter-adsorption surface; a supporting member which supports the other end portion side of the flexible plate so as to support the flexible plate in a cantilever manner; and a movable member which moves the other end portion side of the peeling member toward the other end portion side of the counter-adsorption surface so that the flexible plate is subjected to bending deformation along the peeling proceeding direction with the other end portion side of the flexible plate supported by the supporting member as a fulcrum.

In order to achieve the object of the present invention, one aspect of a peeling method of a laminate of the present invention is a peeling method of a laminate, the laminate including a first substrate and a second substrate stuck thereon, the method including sequentially peeling off an interface between the first substrate and the second substrate along a peeling proceeding direction from one end portion side toward the other end portion side of the laminate by bending deformation of one substrate of the first substrate and the second substrate, in which the peeling method uses: a flexible plate having an adsorption surface which adsorbs and holds the one substrate; a peeling member arranged to face a counter-adsorption surface of the flexible plate which is on a side opposite to the adsorption surface, in which a surface of the peeling member facing the counter-adsorption surface is configured as a convex surface, and one end portion side of the peeling member is fixed to one end portion side of the flexible plate and a part of the convex surface is brought into contact with the counter-adsorption surface so that the other end portion side of the peeling member is spaced from the other end portion side of the counter-adsorption surface; a supporting member which supports the other end portion side of the flexible plate so as to support the flexible plate in a cantilever manner; and a movable member which moves the other end portion side of the peeling member toward the other end portion side of the counter-adsorption surface, and in which the peeling method includes: an adsorbing step of adsorbing the one substrate by the adsorption surface of the flexible plate; and a peeling step of moving the other end portion side of the peeling member toward the other end portion side of the counter-adsorption surface by the movable member so that the flexible plate is subjected to bending deformation along the peeling proceeding direction with the other end portion side of the flexible plate supported by the supporting member as a fulcrum.

In order to achieve the object of the present invention, one aspect of a manufacturing method of an electronic device of the present invention is a manufacturing method of an electronic device, including a functional layer forming process of forming a functional layer on an exposed surface of a first substrate with respect to a laminate including the first substrate and a second substrate stuck thereon, and a separating process of separating the second substrate from the first substrate having the functional layer formed thereon, in which the separating process uses: a flexible plate having an adsorption surface which adsorbs and holds one substrate of the first substrate and the second substrate; a peeling member arranged to face a counter-adsorption surface of the flexible plate which is on a side opposite to the adsorption surface, in which a surface of the peeling member facing the counter-adsorption surface is configured as a convex surface, and one end portion side of the peeling member is fixed to one end portion side of the flexible plate and a part of the convex surface is brought into contact with the counter-adsorption surface so that the other end portion side of the peeling member is spaced from the other end portion side of the counter-adsorption surface; a supporting member which supports the other end portion side of the flexible plate so as to support the flexible plate in a cantilever manner; and a movable member which moves the other end portion side of the peeling member toward the other end portion side of the counter-adsorption surface, and in which the separating process includes: an adsorbing step of adsorbing the one substrate by the adsorption surface of the flexible plate; and a peeling step of moving the other end portion side of the peeling member toward the other end portion side of the counter-adsorption surface by the movable member so that the flexible plate is subjected to bending deformation along a peeling proceeding direction with the other end portion side of the flexible plate supported by the supporting member as a fulcrum.

According to one aspect of the present invention, a peeling device with a simple structure including a flexible plate, a peeling member, a supporting member and a movable member is used. In the adsorbing step, one substrate of the laminate is adsorbed on the adsorption surface of the flexible plate. Next, in the peeling step, the other end portion side of the peeling member is moved toward the other end portion side of the counter-adsorption surface by the movable member. By such a simple peeling movement, the flexible plate is subjected to bending deformation along the peeling proceeding direction with the other end portion side of the flexible plate supported by the supporting member as a fulcrum. Accordingly, one substrate adsorbed by the adsorption surface of the flexible plate is subjected to bending deformation with the flexible plate, whereby one substrate can be peeled off from the other substrate. Therefore, according to one aspect of the present invention, the first substrate and the second substrate can be peeled off from each other with a simple structure and a simple operation.

The movable member of the present invention refers to a member that transmits power, for moving the other end portion side of the peeling member toward the other end portion side of the counter-adsorption surface of the flexible plate, to the peeling member. The power may be from a power source such as electromotion, oil pressure, water pressure, or may be manual. By manual execution, the power source is unnecessary, whereby the structure of the peeling device becomes simpler and peeling movement can be performed with a simple operation.

According to one aspect of the peeling device of the laminate of the present invention, it is preferable that the convex surface of the peeling member is an arc-shaped surface having a constant or continuously changing curvature radius along the peeling proceeding direction.

According to one aspect of the peeling method of the laminate of the present invention, it is preferable that the convex surface of the peeling member is an arc-shaped surface having a constant or continuously changing curvature radius along the peeling proceeding direction and the flexible plate in the peeling step is subjected to bending deformation while being brought into contact with the arc-shaped surface of the peeling member.

According to one aspect of the present invention, the flexible plate during the peeling movement is subjected to bending deformation along the arc-shaped surface of the peeling member. The arc-shaped surface of the peeling member is an arc-shaped surface having a constant or continuously changing curvature radius along the peeling proceeding direction, whereby the entire flexible plate is subjected to bending deformation with a constant or continuously changing curvature radius. Accordingly, damage of the first substrate during the peeling movement and peeling of the first substrate from the adsorption surface of the flexible plate can be inhibited.

According to one aspect of the peeling device of the laminate of the present invention, it is preferable that a close-contact member is provided on the convex surface of the peeling member.

According to one aspect of the peeling method of the laminate of the present invention, it is preferable that the close-contact member is provided on the convex surface of the peeling member and the flexible plate in the peeling step is subjected to bending deformation while being closely contacted with the close-contact member.

According to one aspect of the present invention, the flexible plate during the peeling movement is subjected to bending deformation while being closely contacted with the close-contact member of the peeling member, whereby the flexible plate more easily follows the convex surface of the peeling member. Accordingly, damage of the first substrate during the peeling movement and peeling of the first substrate from the adsorption surface of the flexible plate can be further inhibited.

In addition, peeling of the first substrate may be performed with a smaller force by providing the close-contact member. Further, it is preferable to provide a close-contact area allowing the contact member to closely contact with the flexible plate in advance. Accordingly, the close-contact area easily progresses in the peeling proceeding direction during the peeling movement, whereby it becomes easy to allow the peeling member to closely contact with the flexible plate continuously. Furthermore, in a state after peeling is completed, it is preferable to attach the close-contact member to the peeling member such that a starting point of peeling is formed on a close-contact portion between the flexible plate and the close-contact member. Accordingly, the close-contact member can be easily peeled off from the flexible plate by movement of returning the peeling member to a peeling start position after peeling is completed.

According to one aspect of the peeling device of the laminate of the present invention, it is preferable that the close-contact member is a sheet-shaped adsorption member or pressure-sensitive adhesive member.

According to one aspect of the present invention, during the peeling movement, the flexible plate is subjected to bending deformation while being closely contacted with the sheet-shaped adsorption member or pressure-sensitive adhesive member. Accordingly, the flexible plate is subjected to bending deformation following the convex surface of the peeling member.

According to one aspect of the peeling device of the laminate of the present invention, it is preferable that the close-contact member includes a plurality of fitting portions to be fitted to a plurality of to-be-fitted portions provided along the counter-adsorption surface of the flexible plate.

According to one aspect of the present invention, during the peeling movement, the plurality of fitting portions of the peeling member are fitted to the plurality of to-be-fitted portions of the flexible plate. Accordingly, the flexible plate is subjected to bending deformation along the convex surface of the peeling member.

According to one aspect of the peeling device of the laminate of the present invention, the peeling device preferably includes a holding member that holds the other substrate of the first substrate and the second substrate and a sliding member that slides the holding member in a direction parallel to the other substrate.

According to one aspect of the peeling method of the laminate of the present invention, it is preferable that the other substrate of the first substrate and the second substrate is peeled off while sliding in the direction parallel to the other substrate during the peeling step.

According to one aspect of the present invention, horizontal displacement caused by bending deformation of the first substrate during the peeling movement can be absorbed by sliding of the holding member by the sliding member.

According to one aspect of the peeling device of the laminate of the present invention, it is preferable that the sliding member is provided on a coupled portion between a base on which the supporting member is provided and the holding member.

According to one aspect of the present invention, it is possible to provide a mechanism for sliding the holding member with respect to the base by providing the sliding member on the coupled portion between the base and the holding member.

Advantages of the Invention

According to the peeling device and the peeling method of the laminate and the manufacturing method of the electronic device of the present invention, the first substrate and the second substrate can be peeled off from each other by a simple structure and a simple operation.

MODE FOR CARRYING OUT THE INVENTION

Modes for carrying out the invention will be described below by reference to the accompanying drawings.

Hereinafter, a case where a peeling device and a peeling method of a laminate according to the present invention are used in a manufacturing process of an electronic device will be described.

The term "electronic devices" refers to electronic components, such as semiconductor elements, display panels, solar cells and thin-film secondary batteries. Examples of the display panels include a liquid crystal display panel (LCD), a plasma display panel (PDP), and an organic electro luminescence display panel (OELD).

[Manufacturing Process of Electronic Device]

An electronic device is manufactured by forming a functional layer for an electronic device (a thin film transistor (TFT), a color filter (CF) in the case of the LCD) on a surface of a substrate made of a glass, a resin, a metal or the like.

Before forming the functional layer, a back surface of the substrate is stuck on a reinforcing plate so as to form a laminate. Thereafter, the functional layer is formed on the surface of the substrate in a state of the laminate. After the formation of the functional layer, the reinforcing plate is peeled off from the substrate.

That is, in the manufacturing process of the electronic device, there are a functional layer forming process of forming the functional layer on a surface to be an exposed surface of the substrate in a state of the laminate and a separating process of separating the reinforcing plate from the substrate having the functional layer formed thereon. The peeling device and peeling method of the laminate according to the present invention are applied in this separating process.

The peeling device and the peeling method of the laminate according to the present invention are not limited to the manufacturing process of the electronic device, and for example, may be applied to the manufacturing process of glass lens configuring liquid crystal lens with variable focal distances.

[Laminate 1]

Figure 1:
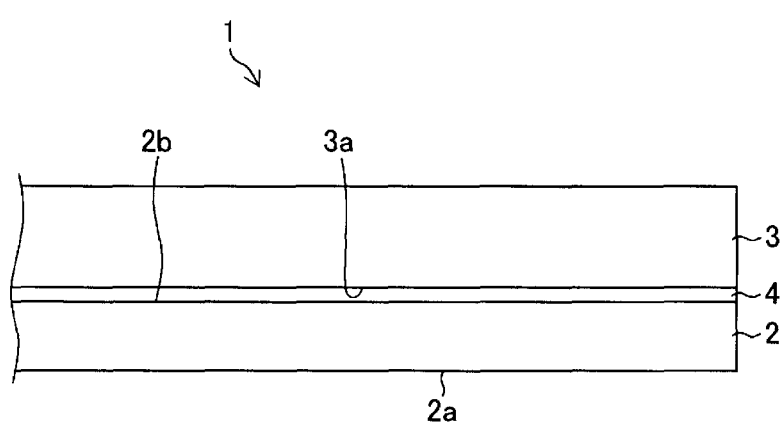
FIG. 1 is an enlarged side view of main portions showing an example of a laminate to be used in a manufacturing process of an electronic device.

FIG. 1 is an enlarged side view of main portions showing an example of a laminate 1.

The laminate 1 includes a substrate (a first substrate) 2 in which the functional layer is to be formed thereon and a reinforcing plate (a second substrate) 3 for reinforcing the substrate 2. In addition, the reinforcing plate 3 has a resin layer 4 as an adsorption layer on a front surface 3a, and a back surface 2b of the substrate 2 is stuck on the resin layer 4. That is, the substrate 2 is peelably stuck on the reinforcing plate 3 via the resin layer 4 by Van der Waals attraction between the substrate 2 and the resin layer 4 or a pressure sensitive adhesive force of the resin layer 4. In addition, examples of the laminate 1 includes a disk-shaped one having a diameter of about 100 mm to 200 mm or a rectangular-shaped one having a side length of 500 mm or less, but the laminate 1 is not limited to such a small sized laminate, may be a laminate having a larger size.

[Substrate 2]

The functional layer is formed on a surface 2a of the substrate 2. Examples of the substrate 2 include a glass substrate, a resin substrate, a metal substrate, and a semiconductor substrate. A semiconductor substrate is a semiconductor substrate having a plurality of electronic circuits formed on the semiconductor substrate such as a silicon wafer or a compound semiconductor wafer. In the case of this semiconductor substrate, an electronic circuit is formed on the back surface 2b thereof. In addition, the thickness of the semiconductor substrate is reduced by grinding the surface 2a thereof. A specific thickness of the semiconductor substrate is about 20 μm to 200 μm.

Among the above-mentioned substrates, the glass substrate is suitable as the substrate 2 for the electronic device due to excellent chemical resistance and moisture permeability resistance and a small linear expansion coefficient. In addition, as the linear expansion coefficient decreases, there is also an advantage that a pattern of the functional layer formed under high temperature becomes difficult to shift during cooling.

Examples of a glass of the glass substrate may include an alkali-free glass, a borosilicate glass, a soda lime glass, a high silica glass, and other oxide-based glasses containing silicon oxide as a main component. As an oxide-based glass, a glass having a silicon oxide content of 40 to 90% by mass in terms of oxide is preferable.

As the glass of the glass substrate, it is preferable to select and adopt a glass suitable for the type of the electronic device to be manufactured and a glass suitable for the manufacturing process thereof. For example, it is preferable to adopt a glass substantially free from an alkali metal component (an alkali-free glass) for a glass substrate for a liquid crystal panel.

The thickness of the substrate 2 is set according to the type of the substrate 2. For example, in the case where the glass substrate is adopted for the substrate 2, in order to reduce the weight and thickness of the electronic device, thickness thereof is preferably set to 0.7 mm or less, more preferably 0.3 mm or less, further more preferably 0.1 mm or less. In the case where the thickness is 0.3 mm or less, good flexibility can be imparted to the glass substrate. Furthermore, in the case where the thickness is 0.1 mm or less, the glass substrate can be wound into a roll, but the thickness thereof is preferably 0.03 mm or more from the viewpoint of manufacturing the glass substrate and handling the glass substrate.

In FIG. 1, the substrate 2 includes a single substrate, but the substrate 2 may be configured by laminating a plurality of substrates.

[Reinforcing Plate 3]

Examples of the reinforcing plate 3 include a glass substrate, a ceramic substrate, a resin substrate, a metal substrate, and a semiconductor substrate, but the glass substrate is used in the embodiment.

The thickness of the reinforcing plate 3 is set to 0.7 mm or less, and is set according to the type and thickness of the substrate 2 to be reinforced. The thickness of the reinforcing plate 3 may be thicker or thinner than that of the substrate 2, but in order to reinforce the substrate 2, it is preferably 0.4 mm or more.

In this embodiment, the reinforcing plate 3 includes a single substrate, but the reinforcing plate 3 may be configured by a laminate in which a plurality of substrates are laminated.

[Resin Layer 4]

In order to prevent the resin layer 4 from peeling off between the resin layer 4 and the reinforcing plate 3, a bonding force between the resin layer 4 and the reinforcing plate 3 is set to be higher than a bonding force between the resin layer 4 and the substrate 2. Accordingly, in the peeling step, an interface between the resin layer 4 and the substrate 2 is peeled off.

The resin configuring the resin layer 4 is not particularly limited, but examples thereof include an acrylic resin, a polyolefin resin, a polyurethane resin, a polyimide resin, a silicone resin, and a polyimide silicone resin. Several kinds of resins may be mixed and used. Among them, the silicone resin and the polyimide silicone resin are preferable from the viewpoint of heat resistance and peelability. In the embodiment, a silicone resin layer is exemplified as the resin layer 4.

The thickness of the resin layer 4 is not particularly limited, but is preferably set to 1 μm to 50 μm, more preferably 4 μm to 20 μm. The thickness of the resin layer 4 is set to 1 μm or more, so that the thickness of air bubbles and foreign substances can be absorbed by deformation of the resin layer 4 when the air bubbles or the foreign substances are mixed between the resin layer 4 and the substrate 2. On the other hand, the thickness of the resin layer 4 is 50 μm or less, so that the time for forming the resin layer 4 can be shortened and the resin layer 4 is economical because the resin for the resin layer 4 is not used more than necessary.

The outer shape of the resin layer 4 is preferably the same as the outer shape of the reinforcing plate 3 or smaller than the outer shape of the reinforcing plate 3 such that the reinforcing plate 3 can support the entire resin layer 4. In addition, the outer shape of the resin layer 4 is preferably the same as the outer shape of the substrate 2 or larger than the outer shape of the substrate 2 such that the resin layer 4 can be closely contacted with the entire substrate 2.

In addition, in FIG. 1, the resin layer 4 includes a single layer, but the resin layer 4 may include two or more layers. In this case, the total thickness of all the layers configuring the resin layer 4 is the thickness of the resin layer. In this case, the kinds of the resins configuring each of the layers may be different.

Further, in the embodiment, the resin layer 4 which is an organic film is used as the adsorption layer, but an inorganic layer may be used instead of the resin layer 4. The inorganic film configuring the inorganic layer includes, for example, at least one selected from the group consisting of metal silicide, nitride, carbide, and carbonitride.

Furthermore, the laminate 1 of FIG. 1 includes the resin layer 4 as the adsorption layer, but the laminate 1 may include the substrate 2 and the reinforcing plate 3 without the resin layer 4. In this case, the substrate 2 and the reinforcing plate 3 are peelably stuck by Van der Waals attraction or the like between the substrate 2 and the reinforcing plate 3. In this case, it is preferable to form an inorganic thin film on the surface 3a of the reinforcing plate 3 such that the substrate 2 which is a glass substrate and the reinforcing plate 3 which is a glass plate do not adhere with each other at high temperature.

[Peeling Start Portion Preparing Device 10]

Figure 2A:
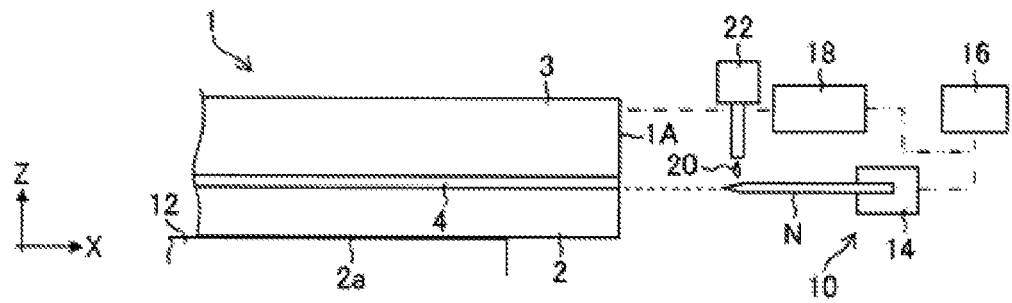
FIGS. 2A to 2C are explanatory views illustrating a peeling start portion preparing method by a peeling start portion preparing device.
Figure 2B:
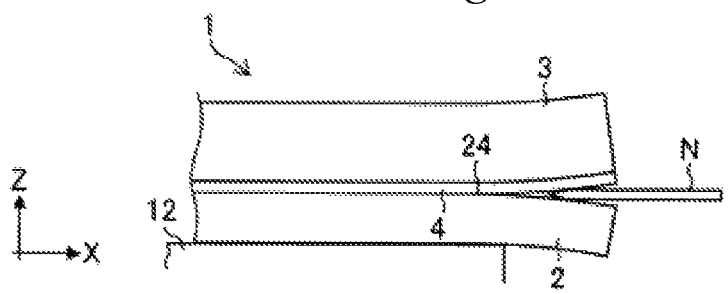
Figure 2C:
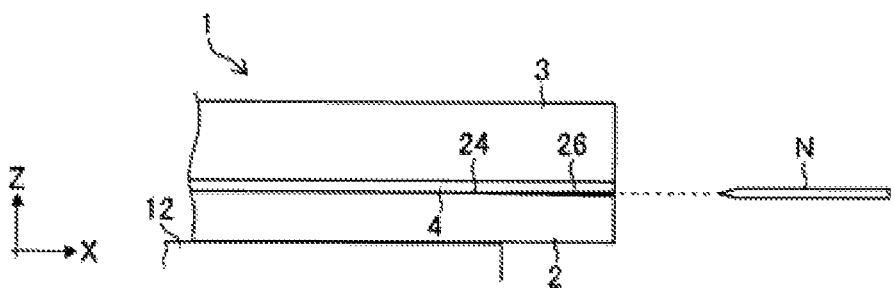
Figure 3:
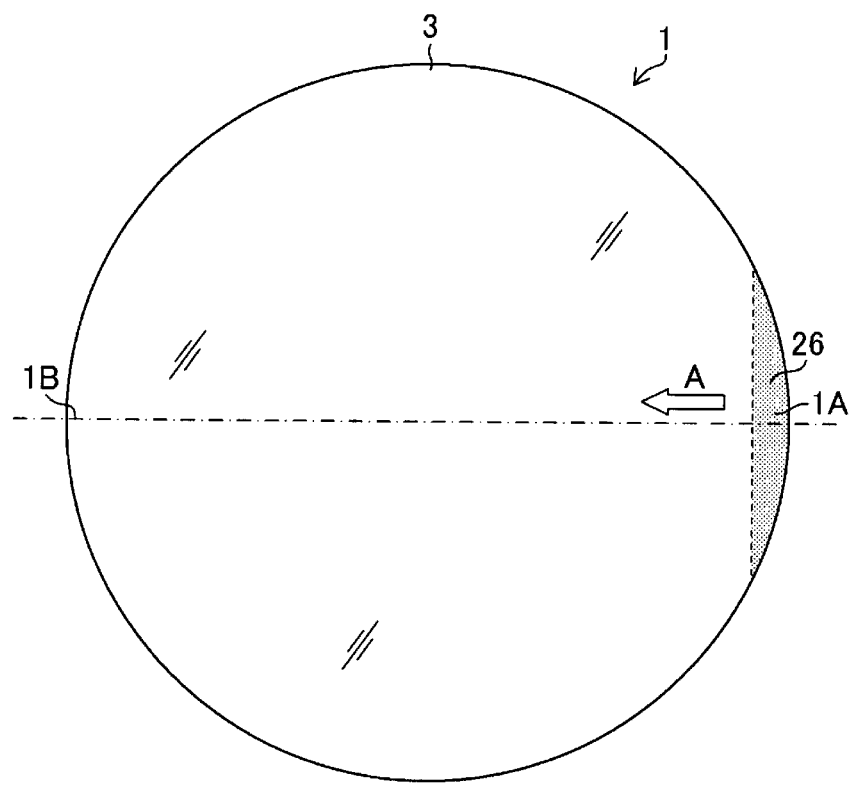
FIG. 3 is a plan view showing a laminate in which the peeling start portion is prepared by the peeling start portion preparing method.

FIGS. 2A to 2C are an explanatory view illustrating a peeling start portion preparing method by a peeling start portion preparing device 10, FIG. 2A is an explanatory view illustrating a positional relationship between the laminate 1 and a knife N, FIG. 2B is an explanatory view for preparing a peeling start portion 26 on an interface 24 by the knife N, and FIG. 2C is an explanatory view of the laminate 1 in which the peeling start portion 26 is formed on the interface 24. FIG. 3 is a plan view showing the laminate 1 in which the peeling start portion 26 is prepared on one end portion 1A side of the laminate 1.

At the time of preparing the peeling start portion 26, in the laminate 1, as shown in FIG. 2A, the surface 2a of the substrate 2 is adsorbed and held on a table 12, and is supported in a horizontal direction (X-axis direction in the drawing).

The knife N is horizontally supported by a holder 14 such that a blade edge faces an end surface of one end portion 1A of the laminate 1. In addition, a position of the knife N in a height direction (Z-axis direction in the drawing) is adjusted by a height adjusting device 16. Further, the knife N and the laminate 1 are relatively moved in the horizontal direction by a feeding device 18 such as a ball screw device. The feeding device 18 may move at least one of the knife N and the table 12 in the horizontal direction, and the knife N is moved in the embodiment. Furthermore, a liquid supply device 22 which supplies a liquid 20 on an upper surface of the knife N before or during insertion is arranged above the knife N.

[Peeling Start Portion Preparing Method]

In an initial state, the blade edge of the knife N presents on a position shifted in the height direction (Z-axis direction) with respect to the interface 24 between the substrate 2 and the resin layer 4 which is an insertion position. Therefore, firstly, as shown in FIG. 2A, the knife N is moved in the height direction, and a height of the blade edge of the knife N is set to a height of the interface 24.

Thereafter, the knife N is moved toward one end portion 1A of the laminate 1 in the horizontal direction, and the knife N is inserted into the interface 24 with a predetermined amount as shown in FIG. 2B. In addition, at the time of insertion of the knife N or before insertion, the liquid 20 is supplied from the liquid supply device 22 to the upper surface of the knife N. Accordingly, the substrate 2 on one end portion 1A is peeled off from the resin layer 4, whereby the peeling start portion 26 is prepared on the interface 24 as shown in FIG. 2C.

The insertion amount of the knife N is preferably set to 7 mm or more, more preferably about 15 mm to 20 mm, according to the size of the laminate 1. The supply of the liquid 20 is not essential, but the liquid 20 remains on the peeling start portion 26 even after the knife N is removed if the liquid 20 is used, whereby the peeling start portion 26 which cannot be reattached can be prepared.

The laminate 1 in which the peeling start portion 26 is prepared is taken out from the peeling start portion preparing device 10 and conveyed to a peeling device to be described later, and the interface 24 is sequentially peeled off by the peeling device.

The peeling method will be described later in detail, as indicated by an arrow A in FIG. 3, the interface 24 is peeled off with the peeling start portion 26 as a starting point by bending the reinforcing plate 3 of the laminate 1 along a peeling proceeding direction from the one end portion 1A toward the other end portion 1B opposite to the one end portion 1A. Accordingly, the reinforcing plate 3 is peeled off from the substrate 2.

[Peeling Device 30]

Figure 4:
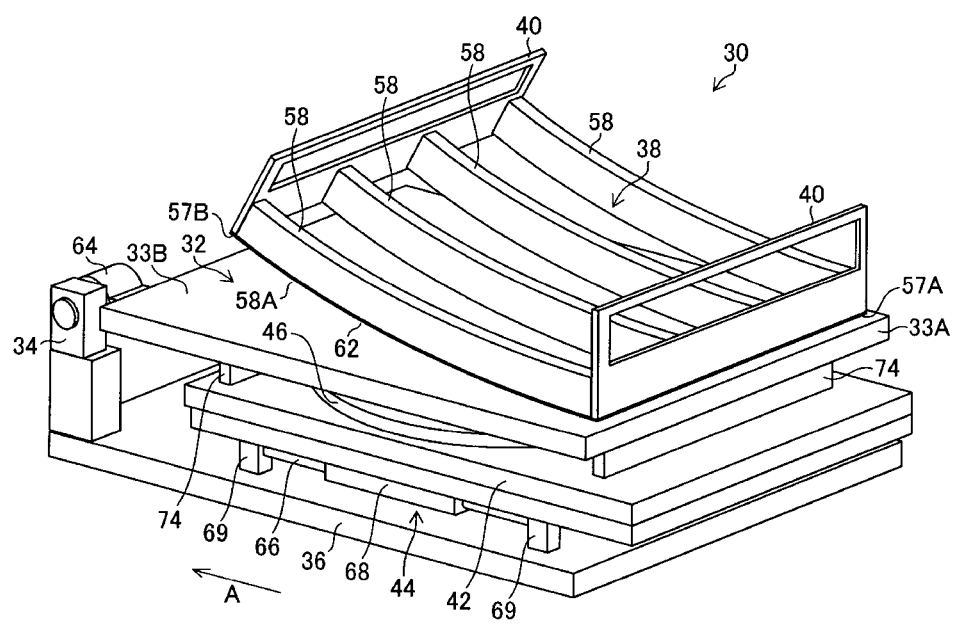
FIG. 4 is an overall perspective view showing a peeling device in an embodiment.
Figure 5:
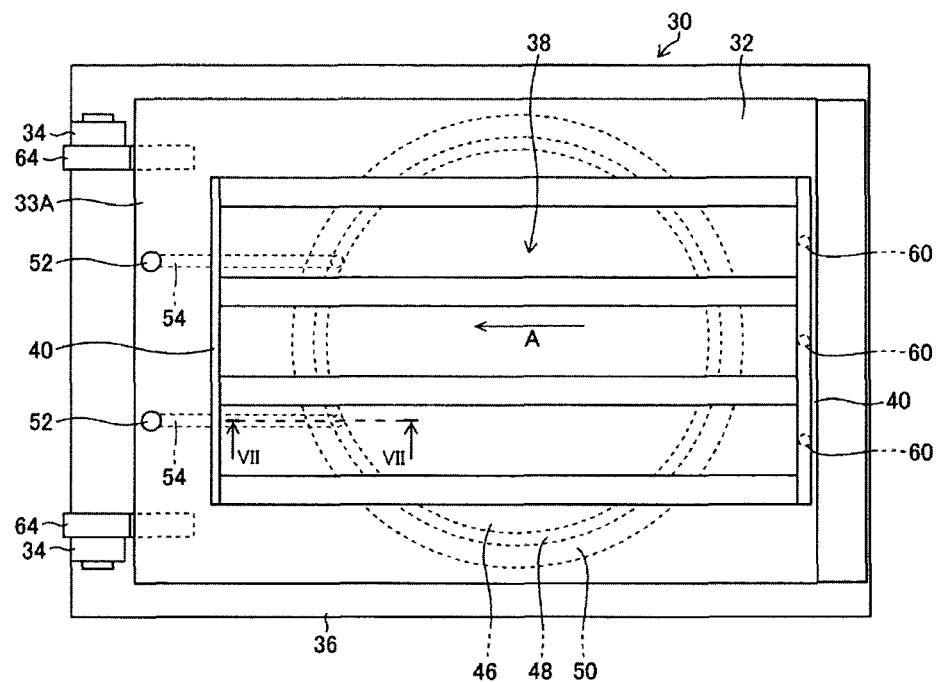
FIG. 5 is a plan view of the peeling device in the embodiment.
Figure 6:
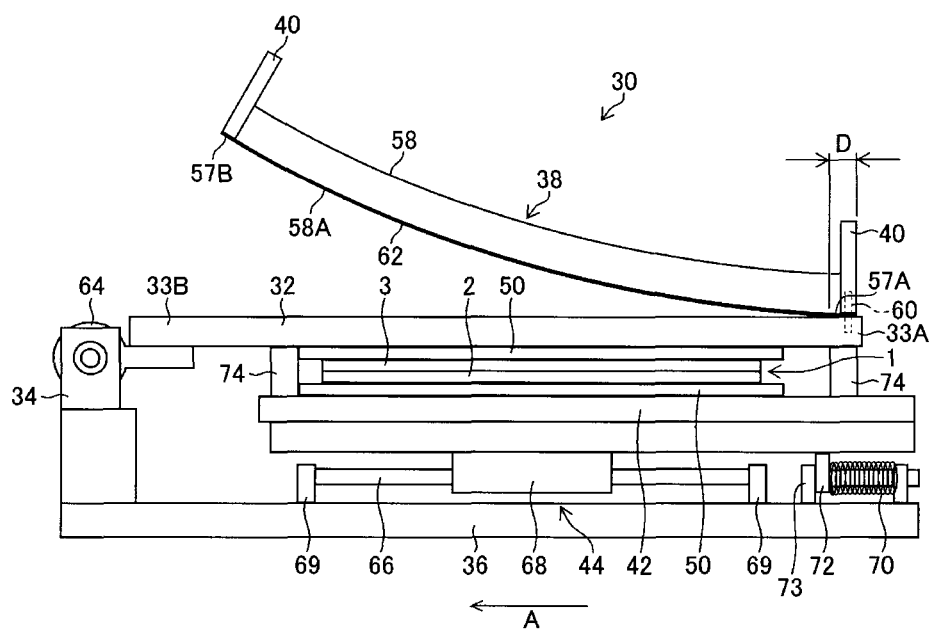
FIG. 6 is a side view of the peeling device in the embodiment.

FIG. 4 is an overall perspective view showing a peeling device 30 of the embodiment, FIG. 5 is a plan view of the peeling device 30, FIG. 6 is a side view of the peeling device 30, and the laminate 1 is illustrated in FIG. 6.

The peeling device 30 in the embodiment is a device that achieves miniaturization and weight reduction and also ensures rigidity in terms of strength in order to correspond to the above-mentioned small sized laminate 1 (see FIG. 3). That is, main members configuring the peeling device 30 are made of plastic materials such as an acrylic resin, a vinyl chloride resin, polypropylene, polycarbonate or the like in order to ensure weight reduction and rigidity. As will be described later, a supporting member 34 which supports in a cantilever manner a flexible plate 32 which adsorbs and holds the reinforcing plate 3 of the laminate 1 and a base 36 which supports the supporting member 34 in a standing manner may be made of metals having high rigidity instead of the plastic materials in order to stably support bending movement of the flexible plate 32. Furthermore, the peeling device 30 in the embodiment applies power to a movable member 40 provided on a peeling member 38 to peel off the peeling member 38, but it is preferable that the power applied to the movable member 40 to perform peeling movement is manual power of an operator for the purpose of miniaturization and weight reduction of the peeling device 30. The power from a power source such as electromotion, oil pressure, water pressure or the like may be applied to the movable member 40. Hereinafter, a configuration of the peeling device 30 will be described.

The peeling device 30 is a peeling device in which one (the reinforcing plate 3 in the embodiment) of the substrate 2 and the reinforcing plate 3 is subjected to bending deformation with respect to the laminate 1 including the substrate 2 and the reinforcing plate 3 stuck thereon, so that the interface 24 between the substrate 2 and the reinforcing plate 3 is sequentially peeled off along the peeling proceeding direction from the one end portion 1A side toward the other end portion 1B side of the laminate 1. In FIGS. 4 to 6, the peeling proceeding direction is indicated by the arrow A. That is, the laminate 1 is mounted to the peeling device 30 such that the arrow A shown in FIG. 3 coincides with the arrow A shown in FIG. 6.

As shown in FIGS. 4 to 6, the peeling device 30 includes the flexible plate 32, the supporting member 34, the peeling member 38, and the movable member 40 as main component members, and also includes a base 36, a table (holding member) 42, and a sliding member 44.

[Flexible Plate 32]

The flat plate-shaped flexible plate 32 holds the reinforcing plate 3 by vacuum adsorption so that the reinforcing plate 3 is subjected to bending deformation. Electrostatic adsorption or magnetic attraction may be adopted instead of vacuum adsorption.

A circular porous air permeable conductive sheet 46 which adsorbs and holds the reinforcing plate 3 of the laminate 1 is attached to a back surface (a lower surface) of the flexible plate 32. The air permeable conductive sheet 46 functions as an adsorption surface.

For the purpose of reducing a tensile stress generated in the reinforcing plate 3 at the time of peeling, the thickness of the air permeable conductive sheet 46 is 2 mm or less, preferably 1 mm or less, and the thickness thereof is 0.5 mm in the embodiment. The Young's modulus of the air permeable conductive sheet 46 is preferably 1 GPa or less. When a small foreign substance such as a glass or metal intrudes, the foreign substance is buried in the porous sheet and the occurrence of a scratch on the reinforcing plate 3 can be prevented.

An annular-shaped elastic body 50 which surrounds the air permeable conductive sheet 46 via a ventilation groove 48 and is brought into contact with an outer edge portion of the reinforcing plate 3 is attached to the back surface of the flexible plate 32. Further, the elastic body 50 is a closed-cell sponge having a Shore E hardness between 20 degrees and 50 degrees, and the thickness thereof is 0.3 mm to 0.6 mm thicker than the thickness of the air permeable conductive sheet 46.

Figure 7:
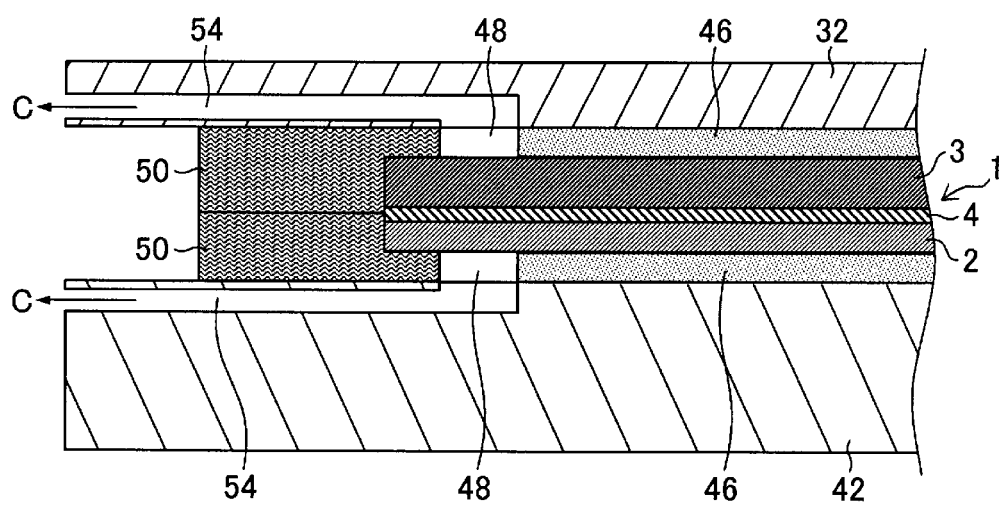
FIG. 7 is a cross-sectional view of main portions of a flexible plate and a table taken along a line VII-VII in FIG. 5.

FIG. 7 is a cross-sectional view of main portions of the flexible plate 32 and the table 42 taken along a line VII-VII in FIG. 5.

The above-mentioned annular-shaped ventilation groove 48 is provided between the air permeable conductive sheet 46 and the elastic body 50 attached to the flexible plate 32. As shown in FIG. 5, in the flexible plate 32, two ventilation holes 52 are opened, and these ventilation holes 52 communicate with the ventilation groove 48 via a ventilation channel 54 in FIG. 7 provided in the flexible plate 32, and the ventilation holes 52 are connected to an intake air source (for example, a vacuum pump) via a suction pipeline (not shown).

Therefore, when the intake air source is driven, the air in the suction pipeline, the ventilation holes 52, the ventilation channel 54 and the ventilation groove 48 is sucked in a direction of an arrow C, so that the reinforcing plate 3 of the laminate 1 is held on the air permeable conductive sheet 46 by vacuum adsorption and supported to the flexible plate 32. In addition, the outer edge portion of the reinforcing plate 3 is pressed against and brought into contact with the elastic body 50, whereby the airtightness of adsorption space surrounded by the elastic body 50 is enhanced.

The same air permeable conductive sheet 46, ventilation groove 48 and elastic body 50 are also provided on a surface (an upper surface) of the flat plate-shaped table 42 which holds the substrate 2 of the laminate 1, and the substrate 2 is held on the air permeable conductive sheet 46 by vacuum adsorption and supported on the table 42 by the same suction movement.

The flexible plate 32 has higher bending rigidity than the air permeable conductive sheet 46 and the elastic body 50. The bending rigidity per unit width (1 mm) of the flexible plate 32 is preferably 1,000 N·mm²/mm to 40,000 N·mm²/mm. For example, in a portion where the width of the flexible plate 32 is 100 mm, the bending rigidity is 100,000 N·mm² to 4,000,000 N·mm². By setting the bending rigidity of the flexible plate 32 to 1,000 N·mm²/mm or more, bending of the reinforcing plate 3 adsorbed and held on the flexible plate 32 can be prevented. In addition, by setting the bending rigidity of the flexible plate 32 to 40,000 N·mm²/mm or less, the reinforcing plate 3 adsorbed and held on the flexible plate 32 can be subjected to bending deformation appropriately.

The flexible plate 32 is a resin member having a Young's modulus of 10 GPa or less, and examples thereof include a member made of a resin such as a polycarbonate resin, a polyvinyl chloride resin, an acrylic resin, and a polyacetal resin.

[Peeling Member 38]

As shown in FIGS. 4 and 5, the peeling member 38 is arranged to face a surface (counter-adsorption surface) opposite to the adsorption surface of the flexible plate 32. In addition, the peeling member 38 includes four plate-shaped ribs 58 having a surface facing the counter-adsorption surface as a convex surface 58A. The number of the ribs 58 is not limited to four, and may be three or more.

The convex surface 58A of the rib 58 is an arc-shaped surface having a constant curvature radius along the peeling proceeding direction indicated by the arrow A. In order that the reinforcing plate 3 is subjected to smooth bending deformation at the time of peeling off the reinforcing plate 3, the curvature radius thereof is preferably 500 mm to 2,000 mm, more preferably 800 mm to 1,600 mm. The convex surface 58A is not limited to the arc-shaped surface having a constant curvature radius and may be an arc-shaped surface having a continuously changing curvature radius.

As shown in FIG. 6, one end portion side 57A, which is a starting point side in the peeling proceeding direction, of the rib 58 is fixed to one end portion side 33A of the flexible plate 32 by a plurality of bolts 60. In addition, the rib 58 is brought into contact with the surface of the flexible plate 32 at the one end portion side 57A which is a part of the convex surface 58A, so that the other end portion side 57B of the rib 58 faces the other end portion side 33B of the surface of the flexible plate 32 and is spaced at an upper position. That is, a posture of the peeling member 38 shown in FIGS. 4 and 6 is a posture before peeling.

The peeling member 38 having the above-mentioned configuration has high rigidity with respect to the flexible plate 32 and controls bending deformation of the flexible plate 32.

In addition, it is preferable to stick a urethane rubber sheet (an adsorption member or pressure-sensitive adhesive member) 62 which is the close-contact member on the convex surface 58A of the rib 58. The urethane rubber sheet 62 improves adsorptivity or pressure-sensitive adhesiveness with respect to the surface of the flexible plate 32, and for example, one having a thickness of 1 mm, a smooth surface and a Shore A hardness of 50 is applied. The flexible plate 32 can be subjected to smooth bending deformation along the convex surface 58A of the rib 58 during the peeling movement by using the urethane rubber sheet 62.

[Supporting Member 34]

As shown in FIG. 5, a pair of the supporting members 34 are arranged and erected on the base 36. In addition, the supporting member 34 supports the other end portion side 33B of the flexible plate 32 via a hinge 64 so as to supports the flexible plate 32 in a cantilever manner. Accordingly, the flexible plate 32 is tiltably supported in a vertical direction with the supporting member 34 as a fulcrum.

[Movable Member 40]

As shown in FIG. 4, the movable member 40 is a handle attached to one end portion side 57A and the other end side 57B of the rib 58 of the peeling member 38. The operator grasps the movable member 40 and moves the other end portion side 57B of the rib 58 toward the other end portion side 33B of the flexible plate 32, so that the flexible plate 32 can be subjected to bending deformation along the peeling proceeding direction with the other end portion side 33B of the flexible plate 32 supported by the supporting member 34 as a fulcrum.

[Sliding Member 44]

A sliding member 44 is provided on a coupled portion between the base 36 and the table 42. The sliding member 44 includes a guide rod 66 disposed along the peeling proceeding direction and a sliding portion 68 sliding along the guide rod 66. Both ends of the guide rod 66 are fixed to a supporting piece 69 fixed to a surface of the base 36, and the sliding portion 68 is fixed to a back surface of the table 42. Preferably, a pair of such sliding members 44 is provided. In addition, as the sliding member 44, it is preferable to apply a linear motion bearing such as a cross roller guide.

To explain the reason for arranging the sliding member 44, the substrate 2 receives a force in a direction opposite to the peeling proceeding direction from the reinforcing plate 3 during the peeling movement of the reinforcing plate 3 which is peeled off while being subjected to bending deformation. In other words, a load that tries to displace the substrate 2 in a direction parallel to the interface 24 is applied to the substrate 2. Therefore, in the peeling device 30, the load is released by coupling the base 36 and the table 42 via the sliding member 44 and allowing the table 42 to slide in a direction opposite to the peeling proceeding direction.

The table 42 slid in the opposite direction is slid against an urging force of a spring 70 in FIG. 6. Then, the force applied to the substrate 2 from the reinforcing plate 3 disappears when the reinforcing plate 3 is completely peeled off from the substrate 2, whereby the table 42 is slid to an original position by the urging force of the spring 70. The spring 70 is arranged on a front side of the base 36 along the peeling proceeding direction, and a pressing piece 72 which presses the spring 70 is provided on the back surface of the table 42. In addition, before the peeling, a stopper 73 which is brought into contact with the pressing piece 72 to position the pressing piece 72 is provided on the surface of the base 36.

The configuration of the peeling device 30 is described as above. In FIGS. 4 and 6, reference numeral 74 denotes a spacer erected on the surface of the table 42, and a height position of the flexible plate 32 with respect to the table 42 is regulated by bringing the back surface of the flexible plate 32 into contact with an upper surface of the spacer 74.

[Peeling Method of Reinforcing Plate 3 by Peeling Device 30]

FIGS. 8A, 8B, 9A and 9B illustrate a peeling method of the reinforcing plate 3 using the peeling device 30 in a time-series manner.

[Adsorbing Step]

Figure 8A:
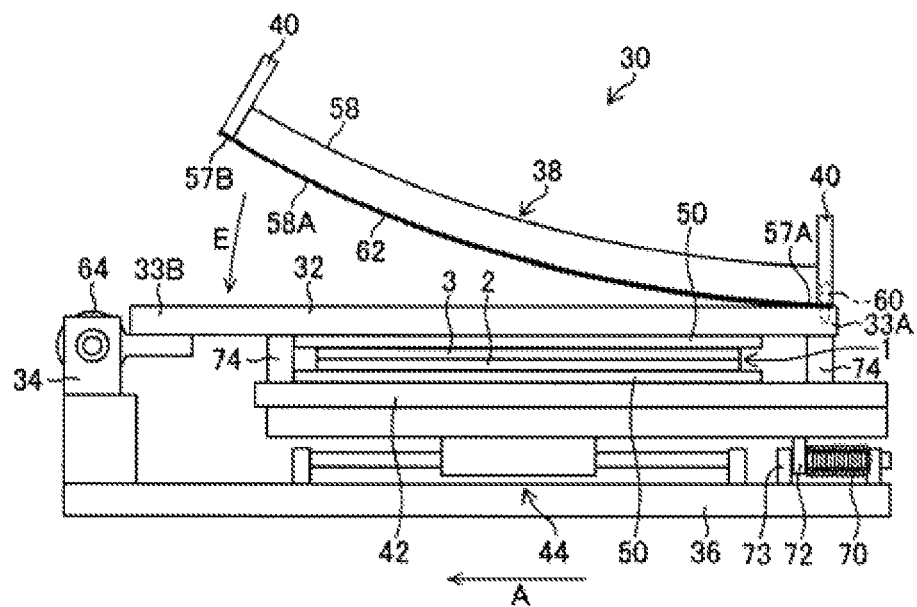
FIGS. 8A and 8B are movement explanatory views illustrating a peeling method of a reinforcing plate using a peeling device.

FIG. 8A illustrates a peeling start mode by the peeling device 30. As a preceding step, the peeling method includes an adsorbing step in which the substrate 2 of the laminate 1 is adsorbed and held on the air permeable conductive sheet 46 (see FIG. 7) of the table 42, and the reinforcing plate 3 of the laminate 1 is adsorbed and held on the air permeable conductive sheet 46 of the flexible plate 32. Accordingly, the peeling start mode in FIG. 8A is obtained.

[Peeling Step]

Figure 8B:
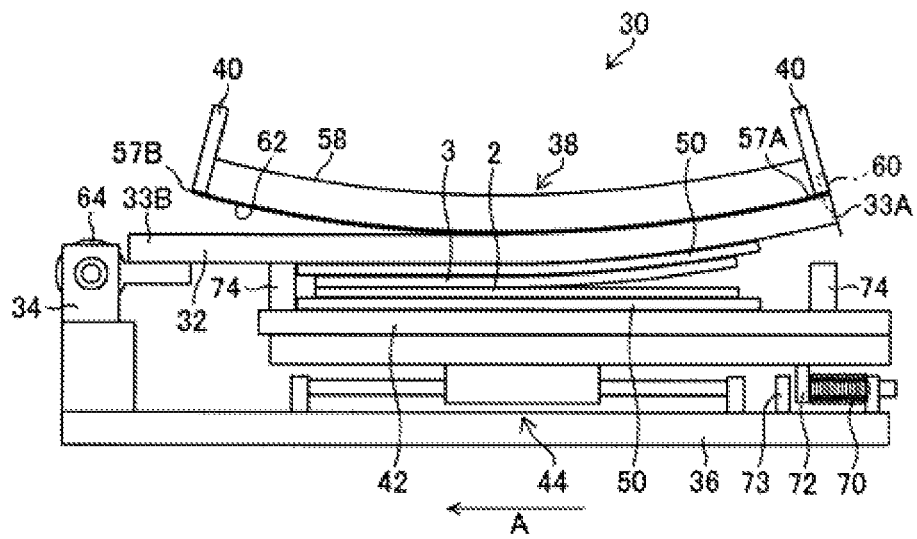
Figure 9A:
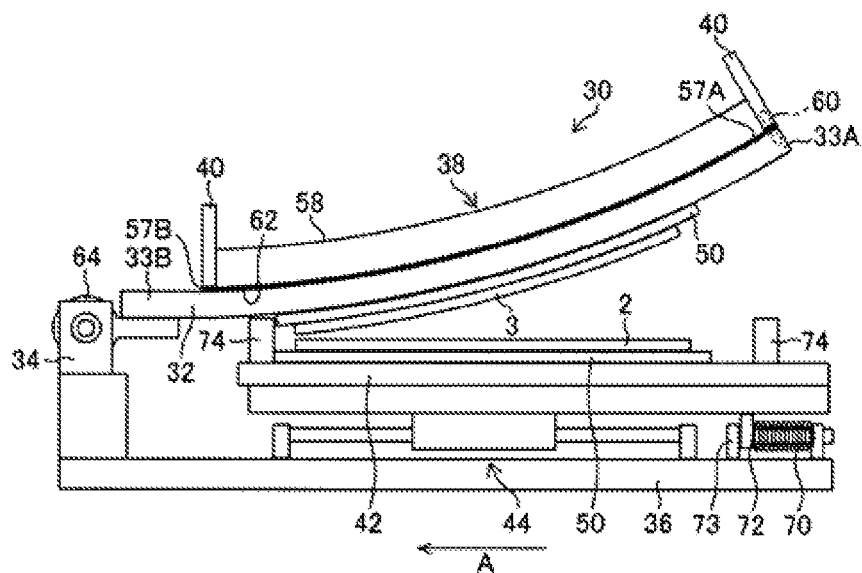
FIGS. 9A and 9B are movement explanatory views illustrating the peeling method of the reinforcing plate using the peeling device.

In the peeling start mode in FIG. 8A, the movable member 40 is grasped, the other end portion side 57B of the rib 58 of the peeling member 38 is pressed (moved) in a direction of an arrow E toward the other end portion side 33B of the flexible plate 32. As shown in FIGS. 8A, 8B and 9A, the flexible plate 32 is subjected to bending deformation along the peeling proceeding direction of the arrow A with the other end portion side 33B of the flexible plate 32 supported by the supporting member 34 as a fulcrum. In conjunction with the peeling movement, the reinforcing plate 3 adsorbed and held on the air permeable conductive sheet 46 of the flexible plate 32 is also subjected to bending deformation with the flexible plate 32 and is sequentially peeled off from the substrate 2 along the peeling proceeding direction.

Here, FIG. 8B illustrates an intermediate mode of the peeling movement, and FIG. 9A illustrates a peeling completion mode in which the peeling movement is completed and the reinforcing plate 3 is completely peeled off from the substrate 2. As shown in these drawings, the flexible plate 32 is subjected to bending deformation with a constant curvature radius by the rib 58 of the peeling member 38 which controls the bending deformation of the flexible plate 32, while following the shape of the convex surface 58A of the rib 58. Then, the reinforcing plate 3 is similarly subjected to bending deformation with a constant curvature radius, and is completely peeled off from the substrate 2 as shown in FIG. 9A. The reinforcing plate 3 can be peeled off from the substrate 2 by the above peeling movement.

Figure 9B:
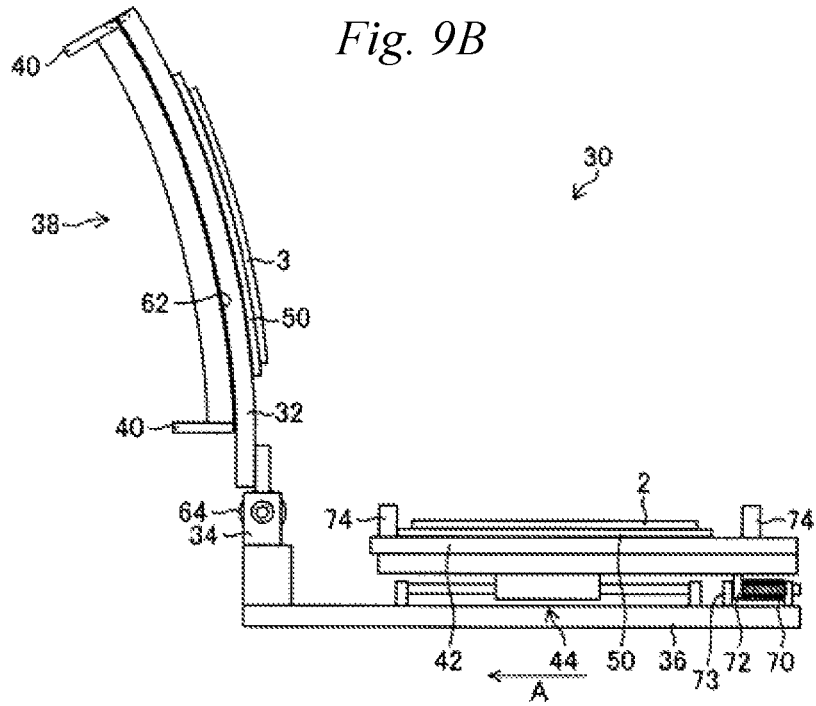

Thereafter, as shown in FIG. 9B, the peeling member 38 is erected with respect to the base 36 by using the hinge 64, and in this state, the adsorption and holding of the reinforcing plate 3 is released and the reinforcing plate 3 is removed from the air permeable conductive sheet 46 of the flexible plate 32. Similarly, the adsorption and holding of the substrate 2 is released, and the substrate 2 is removed from the air permeable conductive sheet 46 of the table 42.

[Effects]

According to the peeling device 30 of the embodiment, the peeling device 30 with a simple structure including the flexible plate 32, the peeling member 38, the supporting member 34 and the movable member 40 is used. In the adsorbing step, the reinforcing plate 3 is adsorbed on the air permeable conductive sheet 46 of the flexible plate 32, and in the peeling step, that is the next step, the other end portion side 57B of the rib 58 of the peeling member 38 can be moved toward the other end portion side 33B of the flexible plate 32 by the movable member 40.

By such simple peeling movement, the flexible plate 32 is subjected to bending deformation along the peeling proceeding direction with the other end portion side 33B of the flexible plate 32 supported by the supporting member 34 as a fulcrum, the reinforcing plate 3 is subjected to bending deformation with the flexible plate 32, whereby the reinforcing plate 3 can be peeled off from the substrate 2.

Therefore, according to the peeling device 30 of the embodiment, the reinforcing plate 3 can be peeled off from the substrate 2 with the simple structure and simple operation.

According to the peeling device 30 of the embodiment, it is preferable that the convex surface 58A of the rib 58 is an arc-shaped surface having a constant or continuously changing curvature radius along the peeling proceeding direction. Accordingly, the flexible plate 32 in the peeling step is subjected to smooth bending deformation while being brought into contact with the arc-shaped surface of the rib 58.

By the way, in the peeling device disclosed in Patent Document 1 using the servo cylinder, sometimes, the one end portion side of the flexible plate is subjected to bending deformation with an extremely small curvature radius since the flexible plate is subjected to bending deformation by applying a towing force of the servo cylinder to one end portion side of the flexible plate. In such a case, there are problems that the first substrate which is subjected to bending deformation with the flexible plate is damaged on a position corresponding to the one end portion side and the first substrate during the peeling is peeled off from the adsorption surface of the flexible plate.

In contrast, in the peeling device 30 of the embodiment, the flexible plate 32 during the peeling movement is subjected to bending deformation along the arc-shaped surface which is the convex surface 58A of the rib 58. The arc-shaped surface is an arc-shaped surface having a constant or continuously changing curvature radius along the peeling proceeding direction, whereby the entire flexible plate 32 is subjected to bending deformation with a constant or continuously changing curvature radius. Accordingly, the damage of the reinforcing plate 3 during the peeling movement and peeling of the reinforcing plate 3 from the flexible plate 32 can be further inhibited.

Figure 10:
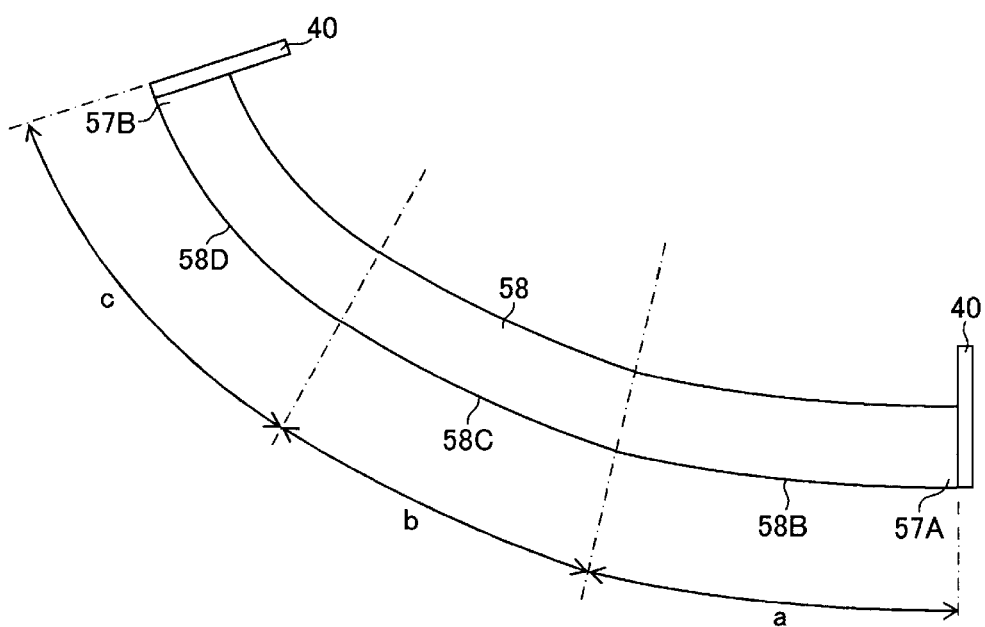
FIG. 10 is an explanatory view showing an example in which curvature radius of an arc-shaped surface of the peeling member continuously changes.

FIG. 10 is an explanatory view showing an example of a convex surface having a continuously changing curvature radius of the arc-shaped surface of the rib 58. According to FIG. 10, the convex surface from one end portion side 57A to the other end portion side 57B of the rib 58 is divided into three parts, and an arc-shaped surface 58B of a first area a from the one end portion side 57A has a curvature radius (R) of 1,200 mm, an arc-shaped surface 58C of a second area b from the first area a has a curvature radius of 1,100 mm, and an arc-shaped surface 58D of a third area c from the second area b to the other end side 57B has a curvature radius of 1,000 mm. The flexible plate 32 can be subjected to smooth bending deformation even with such arc-shaped surfaces.

According to the peeling device 30 of the embodiment, it is preferable that the urethane rubber sheet 62 is provided on the convex surface 58A of the rib 58 and the flexible plate 32 is subjected to bending deformation while being closely contacted with the urethane rubber sheet 62.

Since the flexible plate 32 during the peeling movement is subjected to bending deformation while being closely contacted with the urethane rubber sheet 62 of the peeling member, the flexible plate 32 more easily follows the convex surface 58A of rib 58. Accordingly, the damage of the reinforcing plate 3 during the peeling movement and peeling of the reinforcing plate 3 from the air permeable conductive sheet 46 of the flexible plate 32 can be further inhibited.

In addition, peeling of the reinforcing plate 3 may be performed with a smaller force by providing the urethane rubber sheet 62. Further, as shown in FIG. 6, it is preferable to provide a close-contact area D allowing the urethane rubber sheet 62 to closely contact with the flexible plate 32 in advance. Accordingly, the close-contact area D easily progresses in the peeling proceeding direction during the peeling movement, whereby it becomes easy to allow the peeling member 38 to closely contact with the flexible plate 32 continuously.

Furthermore, it is preferable to attach the urethane rubber sheet 62 to the rib 58 such that a starting point of peeling is formed on a close-contact portion between the flexible plate 32 and the urethane rubber sheet 62 in a state after peeling is completed. Accordingly, after the peeling is completed, the urethane rubber sheet 62 can be easily peeled off from the flexible plate 32 by the movement of returning the peeling member 38 to the peeling start mode in FIG. 8A.

On the other hand, the urethane rubber sheet 62 is exemplified as the close-contact member in the embodiment, but the present invention is not limited thereto.

Figure 11A:
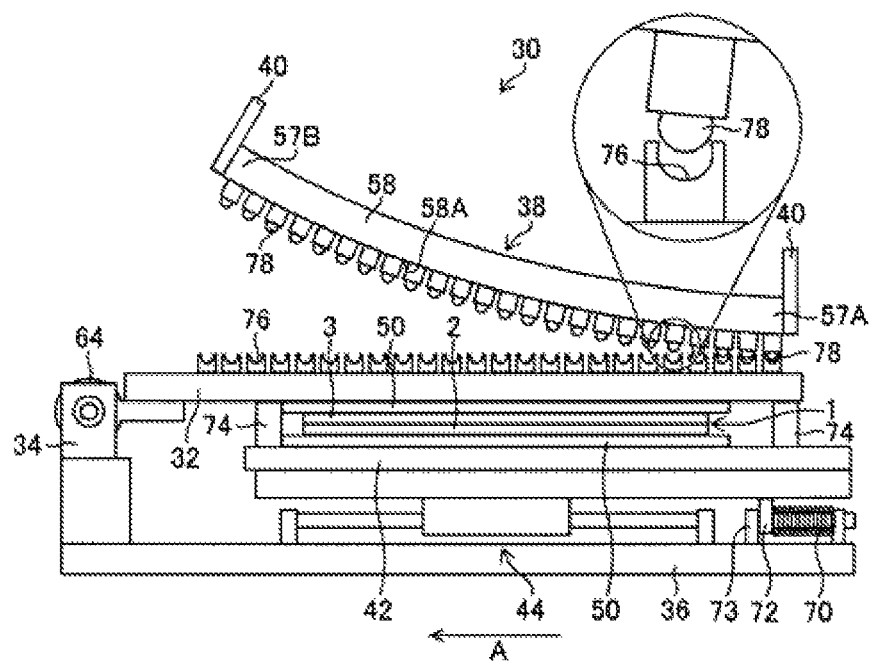
FIGS. 11A and 11B are movement views of a peeling device showing another embodiment of a close-contact member.
Figure 11B:
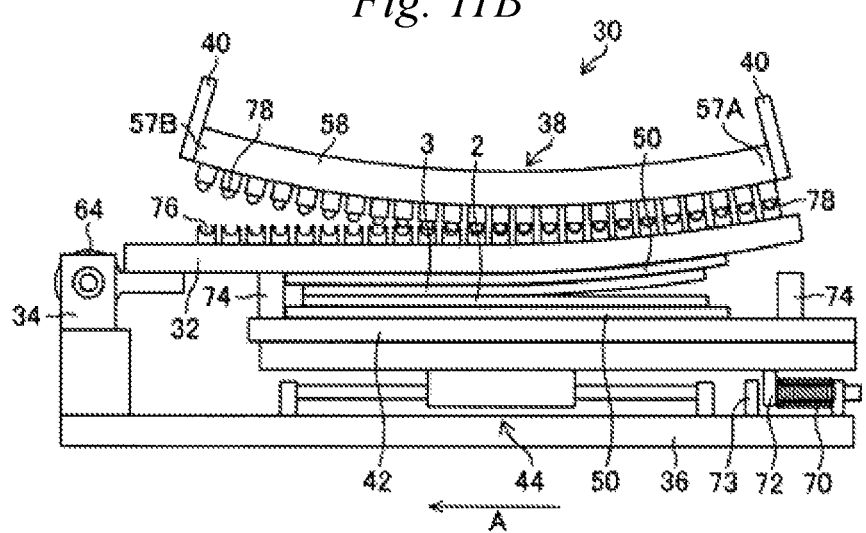
Figure 12:
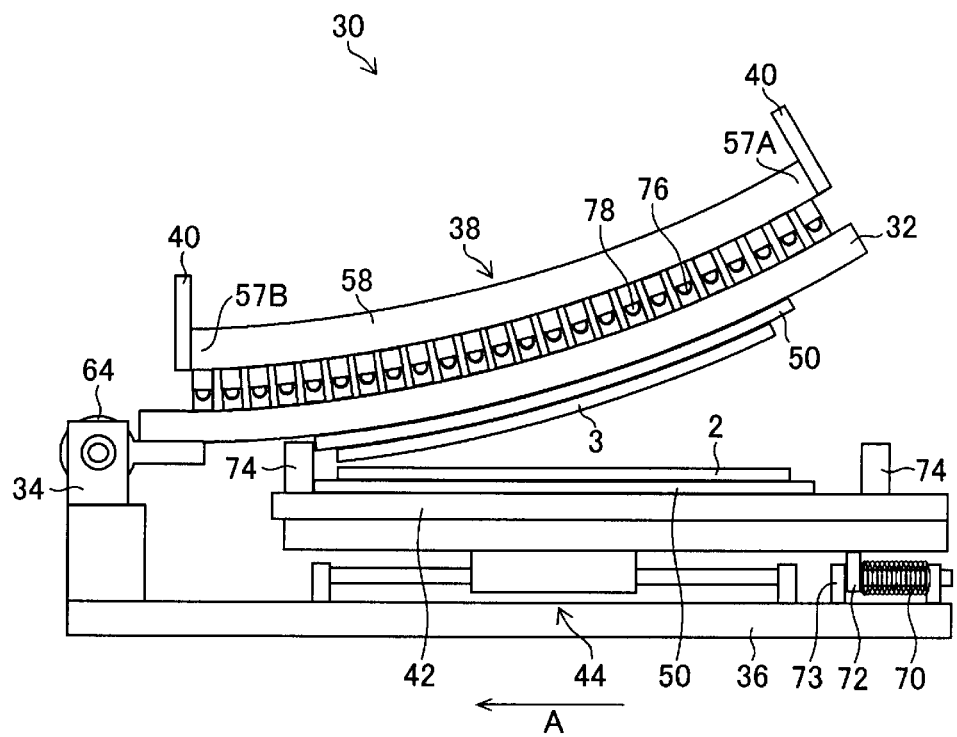
FIG. 12 is a movement view of a peeling device showing another embodiment of the close-contact member.

FIGS. 11A, 11B and 12 are movement views of the peeling device 30 showing another embodiment of a close-contact member. FIG. 11A illustrates a peeling start mode, FIG. 11B illustrates an intermediate mode of the peeling movement, and FIG. 12 illustrates a peeling completion mode.

The close-contact member provided along the convex surface 58A of the rib 58 includes a plurality of spherical-shaped fitting protrusions (fitting portions) 78 to be fitted to the plurality of spherical-shaped to-be-fitted recesses (to-be-fitted portions) 76 provided along the surface of the flexible plate 32.

According to this close-contact member, during the peeling movement, the plurality of fitting protrusions 78 on the side of the rib 58 are sequentially fitted to the plurality of to-be-fitted recesses 76 of the flexible plate 32. Accordingly, the flexible plate 32 can be subjected to bending deformation along the convex surface 58A of the rib 58.

In addition, the peeling device 30 in the embodiment includes the sliding member 44 which slides the table 42 with respect to the base 36. In the peeling step, the sliding member 44 slides the table 42 in a direction opposite to the peeling proceeding direction. Accordingly, horizontal displacement caused by bending deformation of the reinforcing plate 3 during the peeling movement can be absorbed by sliding of the table 42 by the sliding member 44. In addition, it is possible to provide a mechanism for sliding the table 42 with respect to the base 36 since the sliding member 44 is provided on the coupled portion between the base 36 and the table 42.

The present invention is not limited to the above-mentioned embodiments, but the present invention predicts mutual combination of various configurations of the embodiments, modifications and applications made by one skilled in the art based on this description and well-known art, which are included in the scope of the protection sought.

This application is based on Japanese Patent Application No. 2015-204166 filed on Oct. 16, 2015, the entire contents of which are incorporated herein by reference.

DESCRIPTION OF REFERENCE NUMERALS AND SIGNS

N Knife
1 Laminate
2 Substrate
3 Reinforcing plate
4 Resin layer
10 Peeling start portion preparing device
12 Table
14 Holder
16 Height adjusting device
18 Feeding device
20 Liquid
22 Liquid supply device
24 Interface
26 Peeling start portion
30 Peeling device
32 Flexible plate
34 Supporting member
36 Base
38 Peeling member
40 Movable member
42 Table
44 Sliding member
46 Air permeable conductive sheet
48 Ventilation groove
50 Elastic body
52 Ventilation hole
54 Ventilation channel
58 Rib
58A Convex surface
60 Bolt
62 Urethane rubber sheet
64 Hinge
66 Guide rod
68 Sliding portion
70 Spring
72 Pressing piece
73 Stopper
74 Spacer
76 To-be-fitted recess
78 Fitting protrusion

The invention claimed is:

1. A peeling device for peeling a laminate comprising a first substrate and a second substrate, comprising:
  a flexible plate having a counter-adsorption surface, and an adsorption surface which adsorbs and holds one of the first and second substrates such that the flexible plate has the counter-adsorption surface on an opposite side with respect to the adsorption surface;
  a peeling member positioned to face the counter-adsorption surface of the flexible plate and having a convex surface facing the counter-adsorption surface such that one end portion of the peeling member is fixed to one end portion of the flexible plate, that a part of the convex surface is brought into contact with the counter-adsorption surface and that the other end portion of the peeling member is spaced from the other end portion of the counter-adsorption surface;
  a supporting member supporting the other end portion of the flexible plate such that the supporting member is supporting the flexible plate in a cantilever manner; and
  a movable member which moves the other end portion of the peeling member toward the other end portion of the counter-adsorption surface of the flexible plate such that the flexible plate is subjected to bending deformation along a peeling proceeding direction with the other end portion of the flexible plate supported by the supporting member as a fulcrum and sequentially peels off the one of the first and second substrates at an interface between the first substrate and the second substrate along the peeling proceeding direction from the one end portion toward the other end portion of the laminate by bending deformation of the one of the first substrate and the second substrate.

2. The peeling device according to claim 1, wherein the convex surface of the peeling member has an arc-shaped surface having a constant or continuously changing curvature radius along the peeling proceeding direction.

3. The peeling device according to claim 2, wherein the peeling member comprises a plurality of ribs fixed to the one end portion of the flexible plate.

4. The peeling device according to claim 1, wherein the peeling member has a close-contact member on the convex surface of the peeling member.

5. The peeling device according to claim 4, wherein the close-contact member is a sheet-shaped adsorption member or pressure-sensitive adhesive member.

6. The peeling device according to claim 4, wherein the close-contact member includes a plurality of fitting portions configured to be fitted to a plurality of to-be-fitted portions formed along the counter-adsorption surface of the flexible plate.

7. The peeling device according to claim 1, comprising:
  a holding member which holds the other substrate of the first substrate and the second substrate; and
  a sliding member which slides the holding member in a direction parallel to the other substrate.

8. The peeling device according to claim 7, further comprising:
  a base on which the supporting member is positioned, wherein the sliding member is positioned between the base and the holding member.

9. The peeling device according to claim 1, wherein the peeling member comprises a plurality of ribs fixed to the one end portion of the flexible plate.

10. The peeling device according to claim 9, wherein the plurality of ribs is formed such that each of the ribs has a plate shape.

11. The peeling device according to claim 10, wherein the plurality of ribs is fixed to the one end portion of the flexible plate by a plurality of bolts.

12. The peeling device according to claim 1, wherein the convex surface of the peeling member has an arc-shaped surface having a constant curvature radius along the peeling proceeding direction.

13. The peeling device according to claim 1, wherein the convex surface of the peeling member has an arc-shaped surface having a continuously changing curvature radius along the peeling proceeding direction.

14. The peeling device according to claim 1, wherein the movable member is configured to move the other end portion of the peeling member toward the other end portion of the counter-adsorption surface of the flexible plate by application of manual power such that the flexible plate is subjected to bending deformation along the peeling proceeding direction with the other end portion of the flexible plate supported by the supporting member as the fulcrum.

15. The peeling device according to claim 1, wherein the movable member comprises a handle attached to the one end portion of the peeling member and a handle attached to the other end portion of the peeling member and is configured to move the other end portion of the peeling member toward the other end portion of the counter-adsorption surface of the flexible plate by application of manual power such that the flexible plate is subjected to bending deformation along the peeling proceeding direction with the other end portion of the flexible plate supported by the supporting member as the fulcrum.

16. A peeling method for peeling a laminate, comprising:
adsorbing one of the first and second substrates onto an adsorption surface of a flexible plate;
positioning a peeling member having a convex surface such that the convex surface of the peeling member faces a counter-adsorption surface of the flexible plate on an opposite side with respect to the adsorption surface, that one end portion of the peeling member is fixed to one end portion of the flexible plate, that a part of the convex surface is in contact with the counter-adsorption surface of the flexible plate and that the other end portion of the peeling member is spaced from the other end portion of the counter-adsorption surface of the flexible plate; and
moving the other end portion of the peeling member toward the other end portion of the counter-adsorption surface by a movable member such that the flexible plate is subjected to bending deformation along a peeling proceeding direction with the other end portion of the flexible plate supported by a supporting member as a fulcrum and sequentially peels off the one of the first and second substrates at an interface between the first substrate and the second substrate along the peeling proceeding direction from the one end portion toward the other end portion of the laminate by bending deformation of the one of the first substrate and the second substrate,
wherein the supporting member supports the other end portion of the flexible plate such that the supporting member is supporting the flexible plate in a cantilever manner, and the movable member moves the other end portion of the peeling member toward the other end portion of the counter-adsorption surface.

17. The peeling method according to claim 16, wherein the convex surface of the peeling member is an arc-shaped surface having a constant or continuously changing curvature radius along the peeling proceeding direction, and the flexible plate is subjected to the bending deformation while being brought into contact with the arc-shaped surface of the peeling member.

18. The peeling method according to claim 16, wherein the peeling member has a close-contact member on the convex surface of the peeling member, and the flexible plate is subjected to the bending deformation while being closely contacted with the close-contact member.

19. The peeling method according to claim 16, wherein the other substrate of the first substrate and the second substrate is peeled off while sliding in a direction parallel to the other substrate.

20. A method for manufacturing an electronic device, comprising:
forming a functional layer on an exposed surface of a first substrate with respect to a laminate comprising the first substrate and a second substrate; and
separating the second substrate from the first substrate having the functional layer formed thereon,
wherein the separating comprises adsorbing one of the first and second substrates onto an adsorption surface of a flexible plate, positioning a peeling member having a convex surface such that the convex surface of the peeling member faces a counter-adsorption surface of the flexible plate on an opposite side with respect to the adsorption surface, that one end portion of the peeling member is fixed to one end portion of the flexible plate, that a part of the convex surface is in contact with the counter-adsorption surface of the flexible plate and that the other end portion of the peeling member is spaced from the other end portion of the counter-adsorption surface of the flexible plate, and moving the other end portion of the peeling member toward the other end portion of the counter-adsorption surface by a movable member such that the flexible plate is subjected to bending deformation along a peeling proceeding direction with the other end portion of the flexible plate supported by a supporting member as a fulcrum and sequentially peels off the one of the first and second substrates at an interface between the first substrate and the second substrate along the peeling proceeding direction from the one end portion toward the other end portion of the laminate by bending deformation of the one of the first substrate and the second substrate, the supporting member supports the other end portion of the flexible plate such that the supporting member is supporting the flexible plate in a cantilever manner, and the movable member moves the other end portion of the peeling member toward the other end portion of the counter-adsorption surface.

\* \* \* \* \*